United States Patent [19]
Yetter

[11] Patent Number: 5,875,121
[45] Date of Patent: Feb. 23, 1999

[54] REGISTER SELECTION SYSTEM AND METHOD

[75] Inventor: Jeffry D. Yetter, Loveland, Colo.

[73] Assignee: Hewlett-Packard Company, Palo Alto, Calif.

[21] Appl. No.: 692,732

[22] Filed: Aug. 6, 1996

[51] Int. Cl.$^6$ .............................. G06F 17/00; G06F 7/50; G11C 7/00

[52] U.S. Cl. .............................. 364/715.011; 364/716.06; 364/768; 365/195

[58] Field of Search ...................... 364/715.011, 716.03, 364/716.06, 787.01–787.04, 788, 768; 711/219, 220; 365/230.03, 195

[56] References Cited

U.S. PATENT DOCUMENTS

| | | | |
|---|---|---|---|
| 3,761,885 | 9/1973 | Van Heel | 711/220 |
| 4,831,570 | 5/1989 | Abiko | 364/715.011 |
| 4,866,656 | 9/1989 | Hwang | 364/768 |
| 5,305,249 | 4/1994 | Yoshida | 364/768 |
| 5,327,380 | 7/1994 | Kersh, III et al. | 365/195 |
| 5,600,583 | 2/1997 | Bosshart | 364/787 |
| 5,631,860 | 5/1997 | Morinaka | 364/787 |

*Primary Examiner*—Ayaz R. Sheikh
*Assistant Examiner*—Douglas S. Lee

[57] ABSTRACT

A register selection system increases a speed for selection of memory registers when selection is based upon a constant K defined by a sum of two numbers. The register selection system includes a specialized predecoder interconnected with a specialized decode array. The predecoder has first and second address inputs. The predecoder is configured to process first and second address values each of width n on the first and second address inputs respectively in order to produce first, second, third, and fourth predecoded values of width n on respective predecoder outputs. The first, second, third, and fourth predecoded values have respective widths of n+1, n, n, n−1. The decode array, which is connected to the predecoder outputs, is configured to receive the predecoded values. The decode array has $2^{n+1}$ register select outputs corresponding respectively with registers. The decode array is configured to assert one of the register select outputs, while deasserting a remainder of the register select outputs, based upon the predecoded values. As a result, a determination is made as to when the two numbers equal the constant K without performing a summing operation and a carry propagation associated with the summing operation. Moreover, a selection of the one register is accomplished based upon the determination.

8 Claims, 4 Drawing Sheets

REGISTER SELECTION SYSTEM AND METHOD

FIELD OF THE INVENTION

The present invention generally relates to circuitry within computer processors, and more particularly, to a register selection system and method for increasing the speed for selection of registers in a processor when selection is based upon a sum of two numbers.

BACKGROUND OF THE INVENTION

Figure 1:
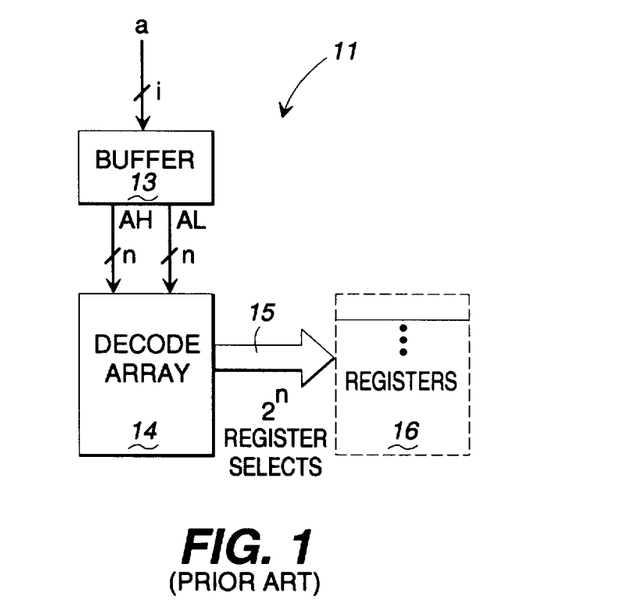
FIG. 1 is a block diagram showing a possible implementation of a conventional register selection system of the prior art.

In a processor for a computer, on-board registers having data or instructions are accessed frequently, especially by the arithmetic logic unit (ALU). For this purpose, a register (or row) selection system is utilized to select a register in a register set for writing or reading data to or from the register. FIG. 1 shows a conventional register selection system 11, which includes a buffer 13 and a decode array 14, for addressing a set of registers 16. The buffer 13 receives an address a (herein, boldface letters designate a vector of bits) having a width n (i.e., n bits) and converts the address into a dual rail representation having two complementary components AH, AL, both having a width n. The decode array 14, typically produced from not-or logic (NOR) gates, receives the components AH, AL, decodes the components AH, AL, and produces $2^n$ register selects 15 for registers 16. One of the register selects 15 is asserted, while the remainder of the register selects 15 is deasserted, so that only one register is selected from the set of registers 16 based upon the address a.

Figure 2:
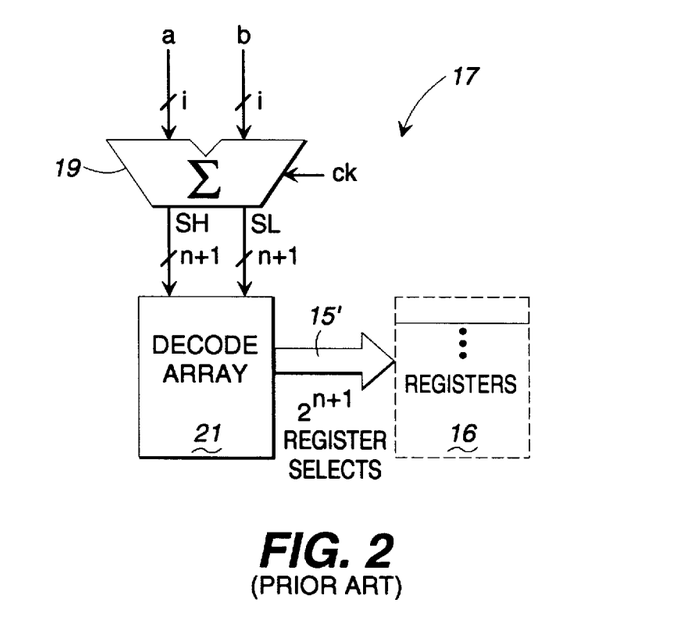
FIG. 2 is a block diagram showing a possible implementation of a conventional register selection system of the prior art wherein register selection is based upon the sum of two numbers, particularly, a base address and an offset address.

Oftentimes, it is necessary to select a register 16 based upon the sum of two addresses. This concept can be expressed mathematically as follows: a+b=K, where a is an offset, b is a base, and K is a constant that defines the desired register location. A conventional register selection system 17 that implements this functionality is set forth in FIG. 2. Referring to FIG. 2, an offset address a and a base address b, both having a width n, are communicated to an adder 19, which is clocked by a clock CK. The adder 19 mathematically sums the offset address a and the base address b in order to produce a result S. The result S is output in a dual rail manner via complementary components SH, SL, both having a width of (n+1). A decode array 21 receives the components SH, SL, decodes the components SH, SL, and produces $2^{n+1}$ register selects 15'. One of the register selects 15' is asserted, while the remainder of the register selects 15' is deasserted, so that only one of the registers 16 is selected. Moreover, the register selection system 17 of FIG. 2 produces more register selects than the register selection system 11 of FIG. 1, because of the summing operation that occurs in the adder 19.

Producing a register select 15' based upon a constant K that is the sum of two numbers is a common requirement in processor designs. Unfortunately, the register selection system 17 of FIG. 2 involves the inclusion of the adder 19, which makes the computation time depend on the delay produced by the carry propagation associated with the addition operation. As a result of the carry propagation, the response time of the system 17 is drastically reduced. In high performance processors, the system 17 of FIG. 2 is not a desirable option because of the serious performance penalty resulting from the carry propagation.

In J. Cortadella and J. N. Llaberia, "Evaluation Of A+B=K Conditions Without Carry Propagation," *IEEE Transactions On Computers*, vol. 41, no. 11, pp. 1484–1488 (1992), it was recognized that the response time of parallel adders is mainly limited by the carry propagation delay. In the context of parallel adders, the authors proposed a theorem and circuit design, shown herein in FIG. 3, for evaluating when the addition of two numbers is equal to another number K without having to perform a summing operation with its attendant carry propagation. Elimination of the carry propagation reduces the response time associated with the parallel adders.

Figure 3:
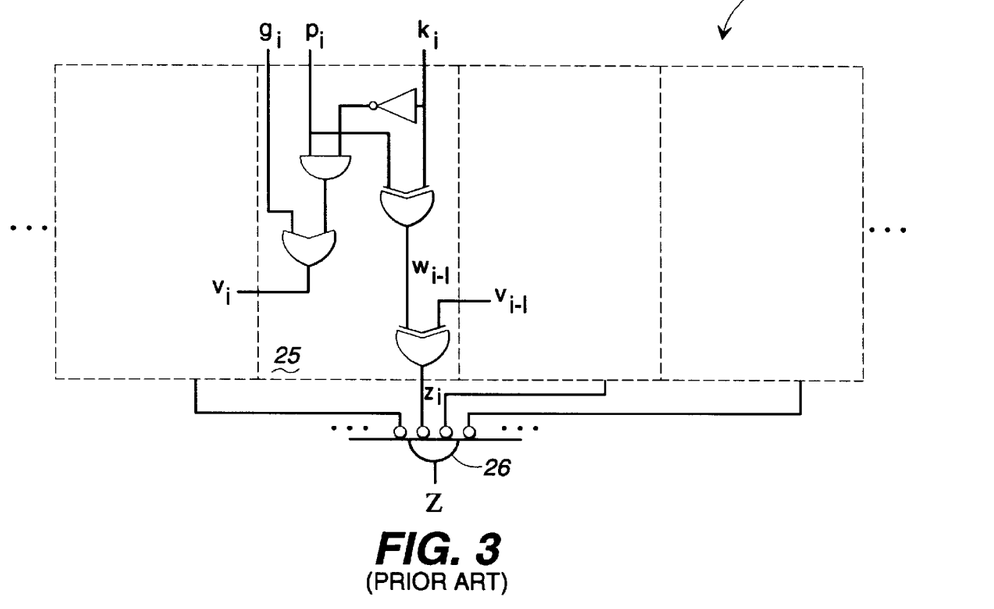
FIG. 3 is a block diagram showing the Cortadella/Llaberia circuit design of the prior art.

As illustrated in FIG. 3, the Cortadella/Llaberia circuit 23 includes a plurality of logically parallel cells 25. Each of the cells 25 receives a generate bit $g_i$ from a previous stage, a propagate bit $p_i$ from a previous stage, a bit $k_i$ of the result K, and a bit $v_{i-1}$ from the neighboring cell corresponding with a bit of lessor value. Each cell 25 produces a bit $v_i$ for its neighboring cell 25 corresponding with a bit of higher value. Based upon the aforementioned inputs, $g_i$, $p_i$, $k_i$, and $v_{i-1}$, each cell 25 produces a bit $z_i$ for not-or (NOR) logic 26. The NOR logic 26 generates an output Z based upon the plurality of inputs $Z_i$. Based upon its logic state, the output Z indicates whether or not the two numbers equal K.

Although the Cortadella/Llaberia theorem and circuit 23 of FIG. 3 have merit for parallel adder configurations, it has not been applied to or proposed in connection with a register selection system 17, as shown in FIG. 2. In fact, use of the Cortadella/Llaberia theorem and circuit 23 of FIG. 3 to eliminate the adder 19 of FIG. 2 would require an undesirable number of circuit cells 25 as well as processor space and complexity, as each cell 25 would need to be replicated once for each register.

Hence, a heretofore unaddressed need exists in the industry for systems and methods for enhancing the speed at which the selection of a register can be accomplished when the selection is based upon a constant that is the sum of two address values.

SUMMARY OF THE INVENTION

The present invention provides a register selection system and method for increasing a speed for selection of memory registers when selection is based upon a constant K defined by a sum of two numbers. Briefly described, in structure, the register selection system includes a specialized predecoder interconnected with a specialized decode array.

The predecoder has first and second address inputs. The predecoder is configured to process first and second address values each of width n on the first and second address inputs respectively in order to produce first, second, third, and fourth predecoded values on respective predecoder outputs having corresponding widths n+1, n, n, n−1.

The decode array, which is connected to the predecoder outputs, is configured to receive the predecoded values. The decode array has $2^{n+1}$ register select outputs corresponding respectively with registers. The decode array is configured to assert one of the register select outputs, while deasserting a remainder of the register select outputs, based upon the predecoded values. As a result, a determination is made as to when the two numbers equal the constant K without performing a summing operation and a carry propagation associated with the summing operation. Moreover, a selection of the one register is accomplished based upon the determination.

The invention can also be conceptualized as providing a methodology for increasing a speed for selection of memory registers when selection is based upon a sum of two numbers, comprising the steps of: a predecoding first and second values to produce first, second, third, and fourth predecoded values; while predecoding, determining when the sum of the first and second values equals a constant without performing a summing operation; and selecting one of the registers while deselecting a remainder of the registers based upon the predecoded values.

The invention has numerous advantages, a few of which are delineated hereafter, as merely examples.

An advantage of the invention is that register selection can be accomplished without having to perform, among other things, a summing operation, a carry propagation, or a compare operation.

Another advantage of the invention is that register selection based upon the sum of two addresses is accomplished in less time than prior art embodiments.

Another advantage of the invention is that, in the decode array, there is a lower number of transistors driven per decoder line as compared to prior art decode arrays.

Another advantage of the invention is that the Cortadella/Llaberia theorem is implemented in the context of register selection with an optimized configuration to make the system suitable and very desirable.

Another advantage of the invention is that it is simple in design, reliable in operation, and suitable for production on a mass scale.

Other objects, features, and advantages of the present invention will become apparent to one with skill in the art upon examination of the following drawings and detailed description. It is intended that all such additional objects, features, and advantages be included herein within the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating principles of the present invention. In the drawings, like reference numerals designate corresponding parts throughout the several views.

DETAILED DESCRIPTION OF THE PREFERRED EMBODIMENT

Use of the Cortadella/Llaberia theorem and circuit 23 of FIG. 3 to eliminate the adder 19 of FIG. 2 would require an undesirable number of circuit cells 25 as well as processor space and complexity, because the Cortadella/Llaberia circuit cell 25 of FIG. 3 would need to be replicated once for each register 16 (FIGS. 1 and 2). In accordance with the present invention, the circuit 23 of FIG. 3 has been modified to significantly reduce its complexity, while making it desirable for use in a register selection system. In this regard, the following strategy was utilized in developing the invention: (1) the result K is treated as a constant instead of a variable; (2) four different variants of the single bit cell 25 of FIG. 3 are devised for the cases in which:

k(i),k(i-1)=0,0
k(i),k(i-1)=0,1
k(i),k(i-1)=1,0
k(i),k(i-1)=1,1

(3) for each of these four cases, the expressions for v(i-1) and z(i) are determined in terms of a(i), b(i,), a(i-1), and b(i-1) (i.e., the operands); (4) the aforementioned expressions are minimized for z(i); and (5) all four of these minimized expressions are implemented (in hardware) once for every bit i. These 4*i circuits can be shared among all of the individual register decoders and are buffered accordingly.

Figure 4:
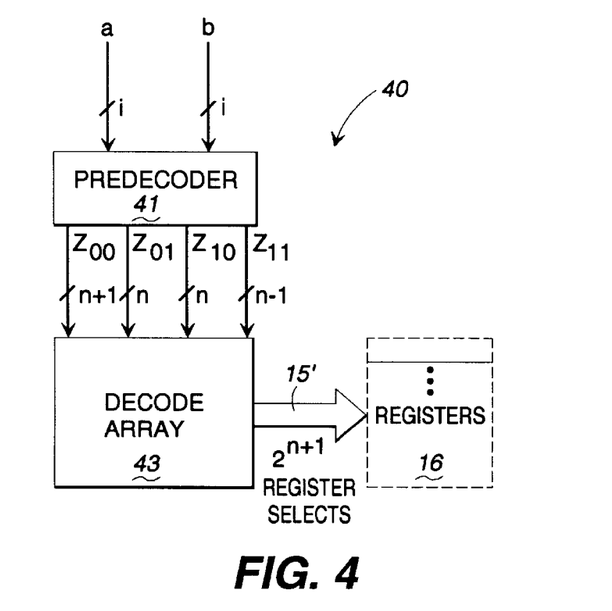
FIG. 4 is a block diagram showing a possible implementation of the register selection system and method of the invention.

To better understand the foregoing concepts and the invention, the invention will now be more specifically described with reference to an example of an implementation. In this regard, FIG. 4 shows a register selection system 40 in accordance with the invention for addressing registers 16. The register selection system 40 generally includes a predecoder 41 interconnected with a decode array 43. The predecoder 41 is configured to receive an offset address value a of width n and a base address value b of width n, to process and predecode the values a, b, and to produce therefrom a plurality of predecoded vectors $z_{00}$, $z_{01}$, $z_{10}$, $z_{11}$ having respective widths n+1, n, n, n-1.

The architecture and functionality of the logic within the predecoder 41 is set forth hereafter.

A. Predecoded Vector $z_{00}$

For purposes of discussion, several definitions are in order. The propagate and generate variables p, g respectively can be defined in relation to the base b and offset a as follows:

$$p_i = a_i \otimes b_i$$

$$g_i = a_i b_i$$

where i is a particular bit in the respective vector value. Further, for this discussion, $k_i$ is defined as the ith bit of the constant K.

The bit values for $z_{00}$, where $z_{00}=Z_{00}[1] \ldots Z_{00}[n]$, are now calculated based upon assumed values for $k_i, k_{i-1}$. Assume the following:

$$k_i, k_{i-1}=0,0$$

With this assumption, pursuant to the Cortadella/Llaberia theorem, each component $Z_{00}[i]$ of $z_{00}$ can be computed as follows:

$$Z_{00}[i] = P_i \otimes (g_{i-1} + P_{i-1})$$

$$Z_{00}[i] = a_i \otimes b_i \otimes (a_{i-1} + b_{i-1})$$

The foregoing equation represents the logic that is implemented in the predecoder 41 of FIG. 4 in order to produce zoo from a and b.

B. Predecoded Vector $z_{01}$

The values for $z_{01}$, where $z_{01}=Z_{01}[1] \ldots Z_{01}[n]$, are calculated based upon another set of assumed values for $k_i, k_{i-1}$. Assume the following:

$$k_i, k_{i-1}=0,1$$

With this assumption, pursuant to the Cortadella/Llaberia theorem, each component $Z_{01}[i]$ of $z_{01}$ can be computed as follows:

$$z_{01}[i] = P_i \otimes g_{i-1}$$

$$z_{01}[i] = a_i \otimes b_i \otimes (a_{i-1} + b_{i-1})$$

The foregoing equation represents the logic that is implemented in the predecoder 41 of FIG. 4 in order to produce $z_{01}$ from a and b.

C. Predecoded Vector $z_{10}$

The values for $z_{10}$, where $z_{10}=Z_{10}[1] \ldots Z_{10}[n]$, are calculated based upon another set of assumed values for $k_i, k_{i-1}$. Assume the following:

$$k_i, k_{i-1} = 1, 0$$

With this assumption, pursuant to the Cortadella/Llaberia theorem, each component $Z_{10}[i]$ of $z_{10}$ can be computed as follows:

$$z_{10}[i] = P_i \otimes (p_{i-1} + g_{i-1})$$

$$z_{10}[i] = \bar{a}_i \otimes b_i \otimes (a_{i-1} * b_{i-1})$$

The foregoing equation represents the logic that is implemented in the predecoder 41 of FIG. 4 in order to produce $z_{10}$ from a and b.

D. Predecoded Vector $z_{11}$

The values for $z_{11}$, where $Z_{11}=Z_{11}[1] \ldots Z_{11}[n]$, are calculated based upon another set of assumed values for $k_i, k_{i-1}$. Assume the following:

$$k_i, k_{i-1} = 1, 1$$

With this assumption, pursuant to the Cortadella/Llaberia theorem, each component $Z_{11}[i]$ of $z_{11}$ can be computed as follows:

$$z_{11}[i] = P_i \otimes g_{i-1}$$

$$z_{11}[i] = \bar{a}_i \otimes b_i \otimes (a_{i-1} * b_{i-1})$$

The foregoing equation represents the logic that is implemented in the predecoder 41 of FIG. 4 in order to produce $z_{11}$ from a and b.

Figure 5A:
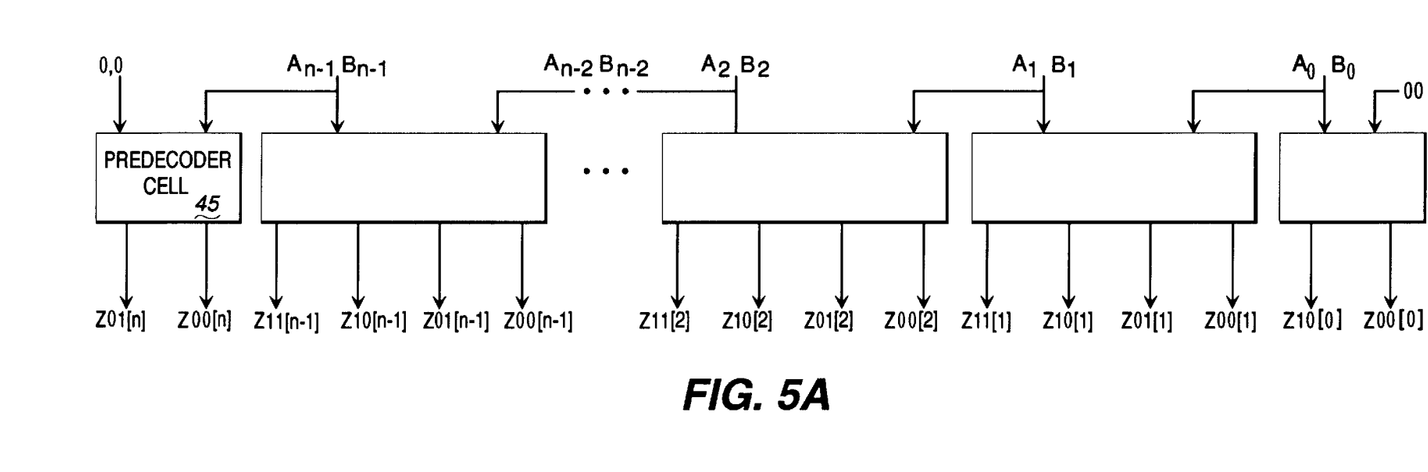
FIG. 5A is a block diagram showing a possible implementation of the predecoder of FIG. 4.

FIG. 5A shows a low level block diagram of the predecoder 41 (FIG. 4). As shown in FIG. 5A, the predecoder 41 is implemented via a plurality of n circuit cells 45. Address vector a comprises vector components, or bits, $A_0 \ldots A_{n-1}$, address vector b comprises bits $B_0 \ldots B_{n-1}$, the predecoded vector $z_{00}$ comprises bits $Z_{00}[0] \ldots Z_{00}[n]$, the predecoded vector $z_{01}$ comprises bits $Z_{01}[0] \ldots Z_{01}[n]$, the predecoded vector $z_{10}$ comprises bits $Z_{10}[0] \ldots Z_{10}[n-1]$, and the predecoded vector $z_{11}$ comprises bits $Z_{11}[1] \ldots Z_{11}[n-1]$.

Note that each circuit cell 45 of FIG. 5A receives two bits from each of the inputs a, b. Specifically, each cell j receives bits $A_j, B_j, A_{j-1}, B_{j-1}$, where j is one of 1 ... n.

Referring again to FIG. 4, the decode array 43 receives the predecoded vectors $z_{00}, z_{01}, z_{10}, z_{11}$ from the predecoder 41, processes and decodes the foregoing predecoded vectors, and produces $2^{n+1}$ register selects 15', or a register selection value (or vector) having $2^{n+1}$ bits. One of the bits is asserted, while the remainder of the bits are deasserted, so that only one register 16 is selected at a time for a read or write operation. Generally, the decode array 43 is programmed differently than the decode arrays 15, 21 of the prior art (FIGS. 1 and 2). The decode array 43 of the invention is specifically adapted to recombine the z values that were precomputed in the predecoder 41 in order to cover all cases of K.

Figure 5B:
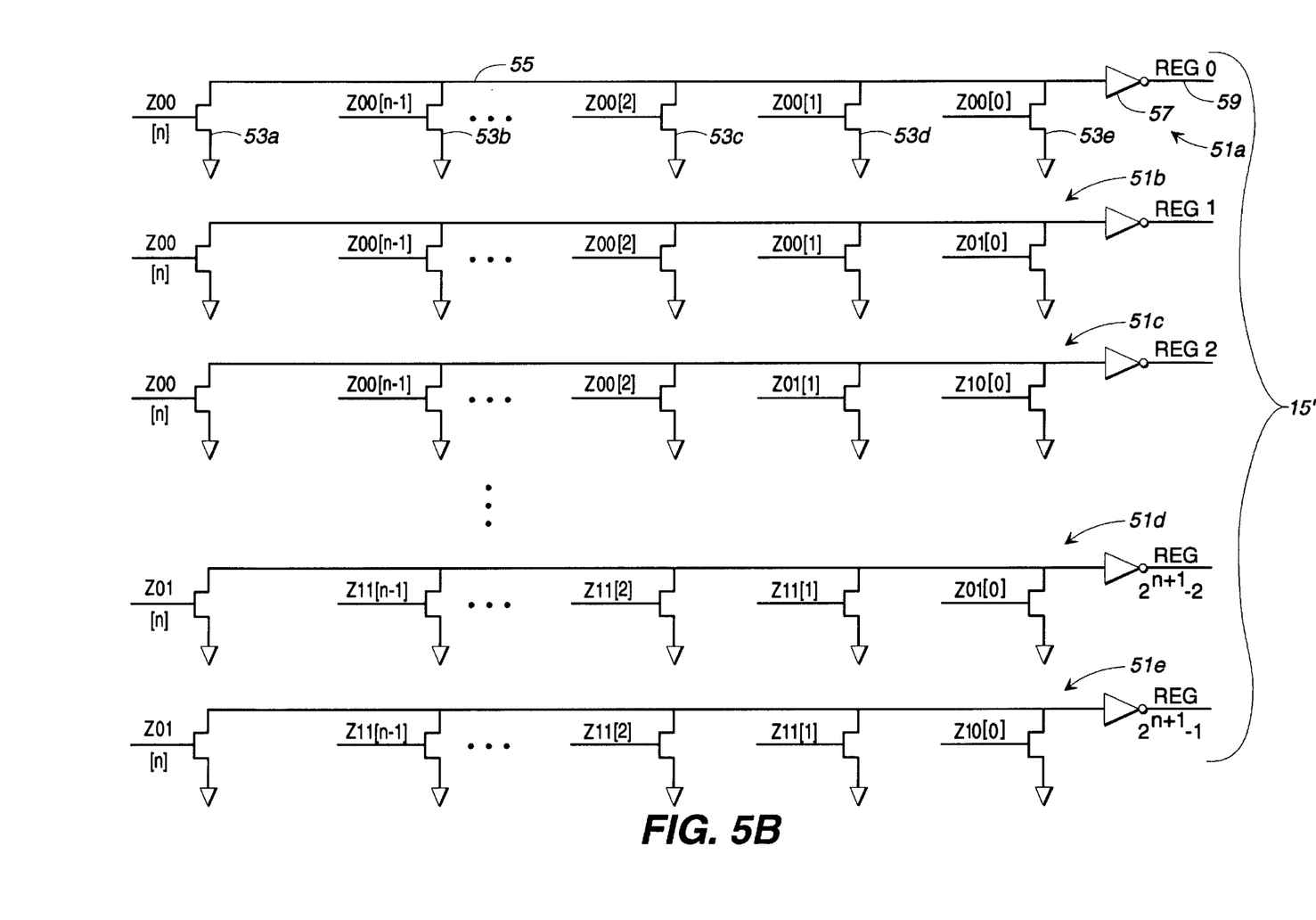
FIG. 5B is a block diagram showing a possible implementation of the decode array of FIG. 4.

FIG. 5B shows a low level block diagram of a possible implementation of the decode array 43 (FIG. 4). As shown in FIG. 5B, the decode array 43 includes a plurality of register selection mechanisms 51. Each register selection mechanism 51 includes a plurality of transistors 53, each of which is connected between a precharge line 55 and ground and each of which is actuated by a vector component Z. In the preferred embodiment, the precharge line 55 is precharged during part of the clock cycle, and evaluation of the vector components is performed during another part of the clock cycle. Further, the precharge line 55 is connected to an inverter 57, which produces an output 59 for a particular register 16. Only one of the lines 59 is asserted, while the remainder of the lines 59 are deasserted, when a register selection is performed.

It is worth noting that the decode array 43 of the invention in FIG. 4 and the decode array 21 of the prior art in FIG. 2 have about the same number of transistors. However, two lines drive the decode array 21 of the prior art, while four lines drive the decode array 43 of the invention. As a result, each input line driving the decode array 43 drives half as many transistors, or said another way, has lower fan out, as compared to the prior art, resulting in faster speed through the decode array and overall higher performance.

Many variations and modifications may be made to the preferred embodiment of the invention, as described previously, without substantially departing from the spirit and scope of the invention. As an example, the register selection system 40 of FIG. 4 could be utilized to address any type of memory, including one that has no registers 16, but merely a plurality of memory locations. As another example, rather than decoding $2^{n+1}$ register selects, the system could be modified to decode half that many, or $2^n$, by implementing a wrap-around feature. In this regard, the outputs $Z_{00}[n]$ and $Z_{01}[n]$ from the predecoder 45 in FIG. 5A could be forced to a logical 0, for instance, by removal of these paths. When register n is decoded, then the system aliases back to register 0, register n+1 aliased back to register 1, and so on. All such modifications and variations are intended to be included herein within the scope of the present invention, as is defined by the claims that follow.

Furthermore, in the claims hereafter, the structures, materials, acts, and equivalents of all "means" elements, "logic" elements, and steps are intended to include any structures, materials, or acts for performing the functions specified in connection with said elements.

Wherefore, the following is claimed:

1. A register selection system for increasing a speed for selection of memory registers when selection is based upon a sum of two numbers, comprising:

a predecoder configured to receive first and second address values, said predecoder configured to process said values in order to compute first, second, third, and fourth predecoded values; and a decode array configured to receive said predecoded values, said decode array configured to generate a select value that selects one of said registers while deselecting a remainder of said registers based upon said predecoded values;

whereby said selection of said one register is accomplished by a combination of said predecoder and said decode array without performing a summing operation.

2. The system of claim 1, wherein said first and second address values correspond to a base and an offset respectively of said summing operation.

3. A register selection system for increasing a speed for selection of memory registers when selection is based upon a sum of two numbers, comprising:

a predecoder configured to receive first and second address values, said predecoder configured to process said values in order to compute first, second third, and fourth predecoded values;

a decode array configured to receive said predecoded values, said decode array configured to generate a select value that selects one of said registers while deselecting a remainder of said registers based upon said predecoded values; and whereby said selection of said one register is accomplished by a combination of said predecoder and said decode array without performing a summing operation; and wherein said first and second address values have a width of n, said first predecoded value has a width of n+1, said second and third predecoded values have a width of n, said fourth predecoded value has a width of n+1, and said select value has a width of $2^{n+1}$.

4. The system of claim 1, wherein said predecoder is configured to generate each of said predecoded values based upon precisely two bits of both said first and second address values.

5. A register selection system for increasing a speed for selection of memory registers when selection is based upon a constant defined by a sum of two numbers, comprising:

a predecoder having first and second address inputs, said predecoder configured to process first and second address values each of width n on said first and second address inputs respectively in order to produce first, second, third, and fourth predecoded values on respective predecoder outputs, said first predecoded value having a width of n+1, said second and third predecoded values having a width of n, said fourth predecoded value having a width of n−1; and a decode array connected to said predecoder outputs and configured to receive said predecoded values, said decode array having $2^{n+1}$ register select outputs corresponding respectively with registers, said decode array configured to assert one of said register select outputs while deasserting a remainder of said register select outputs based upon said predecoded values;

whereby a determination is made as to when said two numbers equal said constant without performing a summing operation and a carry propagation associated with said summing operation and a selection of said one register is accomplished based upon said determination.

6. A register selection method for increasing a speed for selection of memory registers when selection is based upon a sum of two numbers, comprising the steps of:

predecoding first and second values to compute first, second, third, and fourth predecoded values;

while predecoding, determining when said sum of said first and second values equals a constant without performing a summing operation; and selecting one of said registers while deselecting a remainder of said registers based upon said predecoded values.

7. The method of claim 6, further comprising the steps of:

establishing a base of said summing operation as said first value; and establishing an offset of said summing operation as said second value.

8. A register selection method for increasing a speed for selection of memory registers when selection is based upon a sum of two numbers, comprising the steps of:

predecoding first and second values to compute first, second, third, and fourth predecoded values;

while predecoding, determining when said sum of said first and second values equals a constant without performing a summing operation;

selecting one of said registers while deselecting a remainder of said registers based upon said predecoded values;

establishing said first address value with a width of n+1;

establishing said second and third predecoded values with a width of n;

establishing said fourth predecoded value with a width of n−1; and establising said select value with a width of $2^{n+1}$.

* * * * *

UNITED STATES PATENT AND TRADEMARK OFFICE
CERTIFICATE OF CORRECTION

PATENT NO. : 5,875,121
DATED : February 23, 1999
INVENTOR(S) : Jeffrey D. Yetter It is certified that error appears in the above-identified patent and that said Letters Patent is hereby corrected as shown below:

Column 1,
Lines 21 and 31, delete "a" after address and insert therefor -- a --
Line 26, delete "decodes the. components" and insert therefor -- decodes the components --
Line 34, delete "a+b=K" and insert therefor -- a+b=K --
Line 34, delete "where a is an" and insert therefor -- where a is an --
Line 34, delete "b is a base" and insert therefor -- b is a base --
Line 38, delete "address a and" and insert therefor -- address a and --
Line 39, delete "b, both" and insert therefor -- b, both --
Line 41, delete "address a and the base address b" and insert therefor -- address a and the base address b --
Line 42, delete "a result S." and insert therefor -- a result S. --
Line 42, delete "The result S" and insert therefor -- The result S --
Line 62, delete "performance, penalty" and insert therefor -- performance penalty --

Column 4,
Line 26, delete "value a" and insert therefor -- value a --
Line 26, delete "value b" and insert therefor -- value b --
Line 27, delete "values a, b" and insert therefor -- values a, b --
Line 28, delete "$z_{00}, z_{01}, z_{10}, z_{11}$" and insert therefor -- $\mathbf{z}_{00}, \mathbf{z}_{01}, \mathbf{z}_{10}, \mathbf{z}_{11}$ --
Line 34, delete "variables p, g" and insert therefor -- variables p, g --
Line 35, delete "base b and offset a" and insert therefor -- base b and offset a --
Line 50, delete "$z_{oo}$" and insert therefor -- $\mathbf{z}_{oo}$ --
Line 58, delete "zoo" and insert therefor -- $\mathbf{z}_{oo}$ --
Line 58, delete "from a and b" and insert therefor -- from a and b--
Line 60, delete "$z_{01}$, where $z_{01}$" and insert therefor -- $\mathbf{z}_{01}$, where $\mathbf{z}_{01}$ --

UNITED STATES PATENT AND TRADEMARK OFFICE
CERTIFICATE OF CORRECTION

PATENT NO. : 5,875,121
DATED : February 23, 1999
INVENTOR(S) : Jeffrey D. Yetter It is certified that error appears in the above-identified patent and that said Letters Patent is hereby corrected as shown below:

Column 5,
Lines 7 and 23, delete "$z_{01}$ from a and b" and insert therefor -- $\mathbf{z}_{01}$ from $\mathbf{a}$ and $\mathbf{b}$ --
Line 8, delete "$z_{10}$" and insert therefor -- $\mathbf{z}_{10}$ --
Line 25, delete "$z_{11}$, where $Z_{11}$-$Z_{11}$" and insert therefor -- $\mathbf{z}_{11}$, where $\mathbf{z}_{11}$-$\mathbf{Z}_{11}$ --
Line 40, delete "$z_{11}$ from a and b" and insert therefor -- $\mathbf{z}_{11,}$ from $\mathbf{a}$ and $\mathbf{b}$ --
Line 44, delete "vector a" and insert therefor -- vector $\mathbf{a}$ --
Line 45, delete "vector b" and insert therefor -- vector $\mathbf{b}$ --
Line 51, delete "inputs a, b" and insert therefor -- inputs $\mathbf{a}$, $\mathbf{b}$ --
Line 54, delete "$z_{00}$, $z_{01}$, $z_{10}$, $z_{11}$" and insert therefor -- $\mathbf{z}_{00}$, $\mathbf{z}_{01}$, $\mathbf{z}_{10}$, $\mathbf{z}_{11}$ --

Signed and Sealed this

Ninth Day of July, 2002

Attest:

Attesting Officer

JAMES E. ROGAN
Director of the United States Patent and Trademark Office